(12) United States Patent
Erhardt et al.

(10) Patent No.: US 6,723,605 B1
(45) Date of Patent: Apr. 20, 2004

(54) METHOD FOR MANUFACTURING MEMORY WITH HIGH CONDUCTIVITY BITLINE AND SHALLOW TRENCH ISOLATION INTEGRATION

(75) Inventors: Jeffrey P. Erhardt, San Jose, CA (US); Kashmir S. Sahota, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 317 days.

(21) Appl. No.: 10/022,292

(22) Filed: Dec. 15, 2001

(51) Int. Cl.[7] .......................................... H01L 21/8247
(52) U.S. Cl. ........................ 438/258; 438/262; 438/954
(58) Field of Search ............................... 438/257–267, 438/954

(56) References Cited

U.S. PATENT DOCUMENTS

| | | | |
|---|---|---|---|
| 5,635,415 A | * | 6/1997 | Hong .......................... 438/261 |
| 6,071,779 A | * | 6/2000 | Mehrad et al. ............... 438/262 |
| 6,207,493 B1 | * | 3/2001 | Furukawa et al. ............ 438/246 |
| 6,242,305 B1 | * | 6/2001 | Foote et al. ................. 438/262 |
| 6,326,268 B1 | * | 12/2001 | Park et al. ................... 438/262 |
| 2002/0039821 A1 | * | 4/2002 | Wolstenholme ............. 438/257 |

* cited by examiner

*Primary Examiner*—Richard A. Booth
(74) *Attorney, Agent, or Firm*—Mikio Ishimaru (57) ABSTRACT

A method is provided for manufacturing a MirrorBit® Flash memory with high conductivity bitlines and shallow trench isolation integration. A hard mask is formed over a substrate and used to form a core trench and a shallow trench isolation (STI) trench. The trenches are filled with an insulating material in an STI fill process. A core mask is formed over the STI trenches and exposing the core trenches. The insulating material is removed from the core trenches and the core and hard mask are removed. A doped bitline material is deposited on the surface of the semiconductor, which fills the core trench. The surface of the semiconductor is planarized, inlaying insulating material and doped bitline material in the trenches. A thermal anneal causes the dopant diffusion from the doped bitline material into the substrate to form the high conductivity bitlines.

21 Claims, 5 Drawing Sheets

METHOD FOR MANUFACTURING MEMORY WITH HIGH CONDUCTIVITY BITLINE AND SHALLOW TRENCH ISOLATION INTEGRATION

BACKGROUND OF THE INVENTION

1. Technical Field

The present invention relates generally to semiconductor technology and more specifically to shallow trench isolation and bitline integration in MirrorBit® Flash memory.

2. Background Art

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lack erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing multiple bits to be stored in a single cell is known as "MirrorBit®" Flash memory has been developed. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

One significant problem in memory devices is that the implanted conductive bitlines have a relatively high resistivity, which results in higher power requirements, and subsequent heat generation with reduced life expectancy, for the memory cell.

A second significant problem involves the large number of steps needed to form shallow trench isolation (STI). STI is used to electrically isolate the MirrorBit memory in the core region from the other devices in the peripheral area. It consists of trenches filled with an insulator material, such as silicon oxide, forming an electrical barrier to prevent interference between core and peripheral devices. Unfortunately, traditional STI construction requires a large number of processing steps, which are performed separately from those used to create devices in the core. With the prohibitive cost in equipment, time, and planning for each additional step, it is crucial to minimize the number of process steps.

A third significant problem is that, during implantation of the bitlines, dopant is subject to a scattering effect. The impact of the dopant on and in the semiconductor substrate causes the dopant ions to scatter at angles away from the direction of implantation so the ions not end up directly under the implantation region. As a result, when the bitline and dopant are annealed, the dopant diffuses over a wider region than desired. This severely limits how closely the bitlines can be placed and, thus, how small the memory device can be made.

A solution that would solve the above and other problems with implanted bitlines has been long sought but has long eluded those skilled in the art.

DISCLOSURE OF THE INVENTION

The present invention provides a method for manufacturing a Flash memory with high conductivity bitlines and shallow trench isolation integration. A hard mask layer is deposited over a substrate. A first photoresist is deposited over the hard mask layer, processed, and used to form a hard mask. The first photoresist is removed and the substrate is processed using the hard mask to form a core trench and a shallow trench isolation (STI) trench. The trenches are filled with an insulating material in an STI fill process. A second photoresist is deposited and processed to form a core mask over the STI trenches. Using the core mask, the insulating material is removed from the core trenches and the core mask is removed. A doped bitline material is deposited on the surface of the semiconductor, which fills the core trench. The surface of the semiconductor is planarized, inlaying insulating material and doped bitline material in the trenches. A thermal anneal outdiffuses the dopant from the doped bitline material into the substrate.

The present invention further provides high conductivity bitlines for Flash memory and a manufacturing method therefor.

The present invention also provides a method for manufacturing Flash memory, which integrates STI and bitline creation, resulting in fewer process steps.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
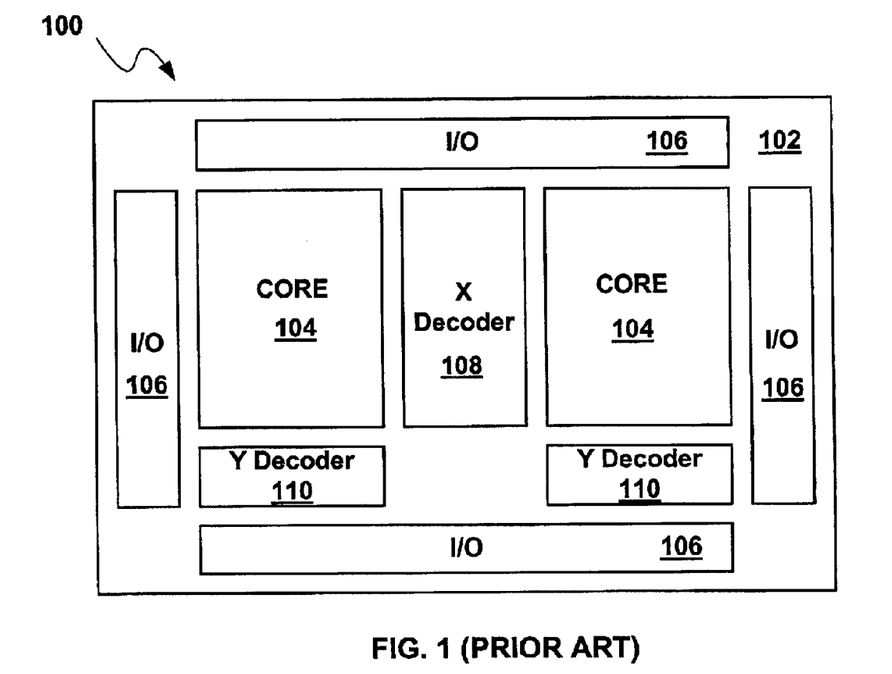
FIG. 1 (PRIOR ART) is a plan view of a conventional MirrorBit Flash EEPROM.

Referring now to FIG. 1 (PRIOR ART), therein is shown a plan view of a MirrorBit® Flash EEPROM 100, which commonly includes a semiconductor substrate 102 in which one or more high-density core regions and one or more low-density peripheral portions are formed. High-density core regions typically include one or more M×N array cores 104 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "side" and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Figure 2:
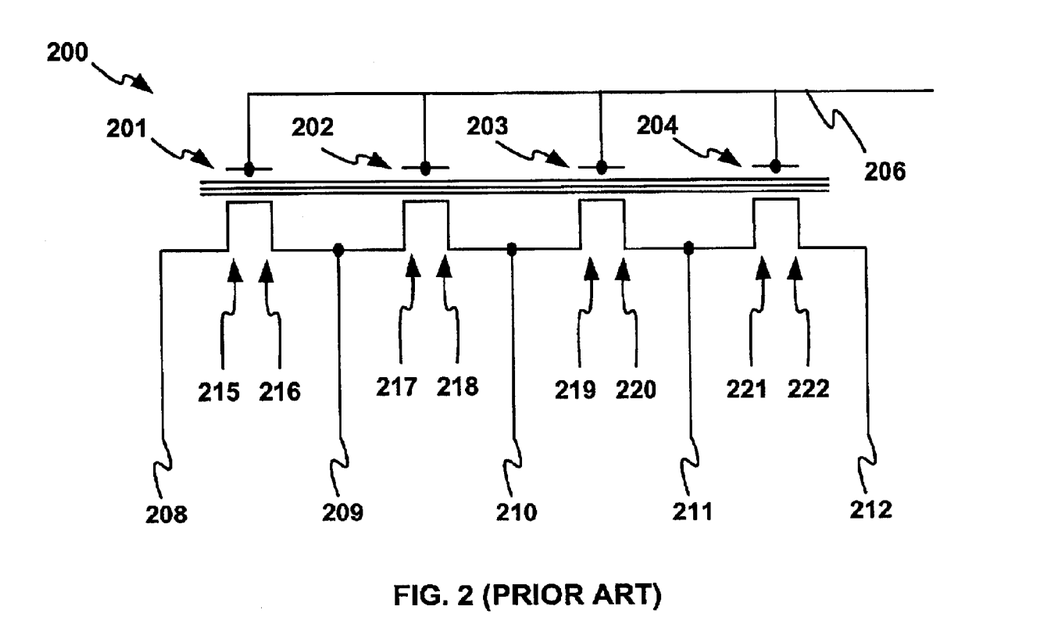
FIG. 2 (PRIOR ART) is a circuit schematic of a portion of one of the M×N array cores of FIG. 1 (PRIOR ART)

Referring now to FIG. 2 (PRIOR ART), therein is shown a circuit schematic of a portion of one of the M×N array cores 104 of FIG. 1 (PRIOR ART). The circuit schematic shows a line of memory cells 200, which includes memory cells 201 through 204 and which together can form an 8-bit word. Each of the memory cells 201 through 204 is connected to a wordline 206, which acts as a control gate. Each of the memory cells 201 through 204 has two associated bitlines with most of the memory cells having a common bitline. The memory cell 201 has associated bitlines 208 and 209; the memory cell 202 has associated bitlines 209 and 210; the memory cell 203 has associated bitlines 210 and 211; and the memory cell 204 has associated bitlines 211 and 212.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. Although adjacent memory cells share common bitlines, the adjacent memory cells do not interfere with each other because the memory cells are programmed one at a time and only one memory cell is active at a time while programming.

Figure 3:
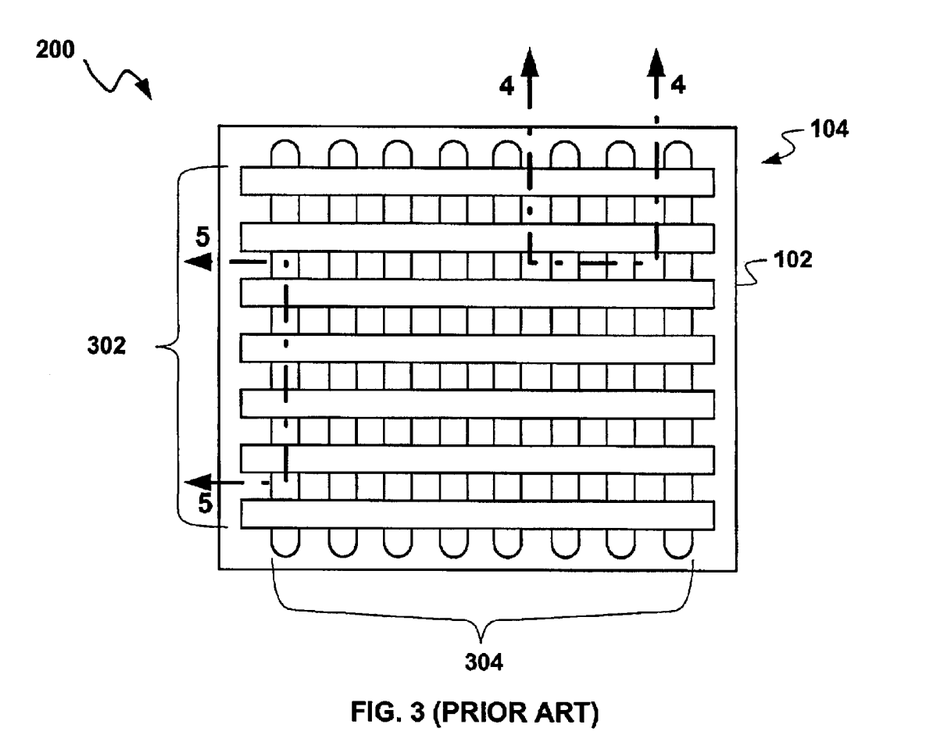
FIG. 3 (PRIOR ART) is a plan view of a portion of one of the M×N array cores 104 of FIG. 1 (PRIOR ART)

Referring now to FIG. 3 (PRIOR ART), therein is shown a plan view of a portion of one of the M×N array cores 104 of FIG. 1 (PRIOR ART). The semiconductor substrate 102 has a plurality of implanted bitlines 304 extending in parallel with a plurality of formed wordlines 302 extending in parallel and at right angles to the plurality of implanted bitlines 304. The wordlines 302 and bitlines 304 have contacts and interconnections (not shown) to the programming circuitry represented in part by x-decoders 108 and y-decoders 110 of FIG. 1 (PRIOR ART).

Figure 4:
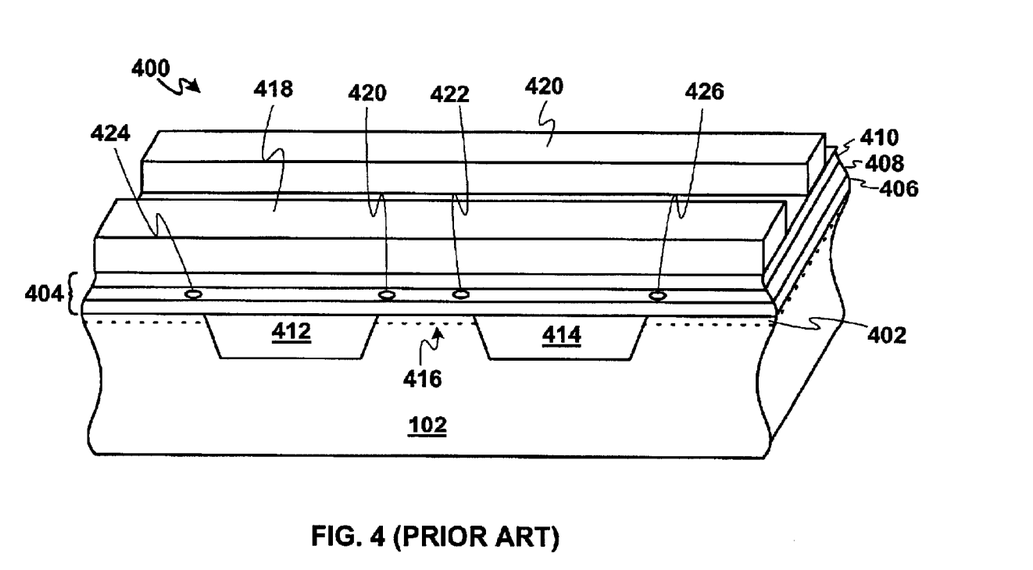
FIG. 4 (PRIOR ART) is a cross-sectional isometric view of a typical MirrorBit Flash memory cell along the line 4—4 of FIG. 3 (PRIOR ART)

Referring now to FIG. 4 (PRIOR ART), therein is shown a cross-sectional isometric view of a typical MirrorBit Flash memory cell along the line 4—4 of FIG. 3 (PRIOR ART), such as a memory cell 400. The semiconductor substrate 102 is a p-doped silicon substrate with a threshold adjustment implant 402 of a p-type material, such as boron. The threshold adjustment implant 402 provides a region that is more heavily doped than the semiconductor substrate 102 itself and assists in the control of the threshold voltage of the memory cell 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are of an oxide dielectric such as silicon dioxide ($SiO_2$) and the charge-trapping layer 408 is of a nitride dielectric such as silicon nitride (SiN). The oxide-nitride-oxide configuration is frequently referred to as a matter of convenience as an "ONO layer".

The bitlines 304 of FIG. 3 (PRIOR ART) are implanted under the charge-trapping dielectric layer 404 in the semiconductor substrate 102 as typified by first and second conductive bitlines 412 and 414. They are typically of an implanted n-type material, such as arsenic, and can include an oxide portion (not shown) in some embodiments. The first and second conductive bitlines 412 and 414 are spaced apart and define a volume between them with the threshold adjustment implant 402, which is a channel 416.

A material, such as polysilicon, is deposited over the charge-trapping dielectric layer 404, patterned, etched, and stripped resulting in a wordline 418. The wordline 418 is one of the wordlines 302 in FIG. 3 (PRIOR ART).

It is understood that the implementation of each step in manufacturing has associated processing steps including, but not limited to, patterning and masking, etching, depositing, implanting and/or stripping, all of which are commonly known to those having ordinary skill in the art.

For convenience, when looking at FIG. 4 (PRIOR ART), the wordline 418 is also referred to as the "control gate" and the bitlines 412 and 414 are designated as "left" and "right" bitlines. When the bitlines 412 and 414 are respectively connected to drain and source, they are also respectively referred to as "drain" and "source" and, when the bitlines 412 and 414 are respectively connected to source and drain, they are also respectively referred to as "source" and "drain". While the bits in a memory cell are generally referred to as "first" and "complementary" bits, for ease of explanation herein, the separate bits are respectively designated as "left" and "right" bits herein, with each bitline having a left and right bit.

During programming of a right bit, such as the right bit 420 of the bitline 412, the bitline 412 is the drain and the bitline 414 is the source. When the wordline 418 is positively charged as the control gate, electrical fields are generated that cause hot electron injection from the drain bitline 412 into the channel 416 and towards the wordline 418. The negatively charged electrons gain the most energy at the drain so they pass through the first insulating layer 406 and into the charge-trapping layer 408 where they are trapped because they do not have enough energy to pass through the second insulating layer 410. These trapped electrons are a bit of information, which is the right bit 420. The right bit 420 can be detected during "reads" and remains until it is "erased" by a negative charge applied to the control gate.

Similarly, during programming of a left bit, such as the left bit 422 of the bitline 412, the bitline 414 is the drain and the bitline 412 is the source. When the wordline 418 is positively charged as the control gate, electrical fields are generated that cause hot electron injection from the drain bitline 414 into the channel 416 and towards the wordline 418. The negatively charged electrons gain the most energy at the drain so they pass through the first insulating layer 406 and into the charge-trapping layer 408 where they are trapped because they do not have enough energy to pass through the second insulating layer 410. These trapped electrons are a bit of information, which is the left bit 422. The left bit 422 can be detected during "reads" and remains until it is "erased" by a negative charge applied to the control gate.

Because the charge-tapping layer 408 is also a dielectric material, generally silicon nitride, the electrons do not move or migrate between right and left so the two bits are independent of each other. Further, the right bit is affected by the electrons coming from the right drain and the left bit is affected by the electrons from the left drain connection so the interchanging of the source and drain do not significantly affect the bit next to the source connection. Further, since the memory cell 400 is programmed individually, the source or drain connections will only effect bits 420 and 422; i.e., bits 424 and 426 would not be affected because the bitlines (not shown) to the left and right of bitlines 412 and 414 would not be connected to either source or drain.

Figure 5:
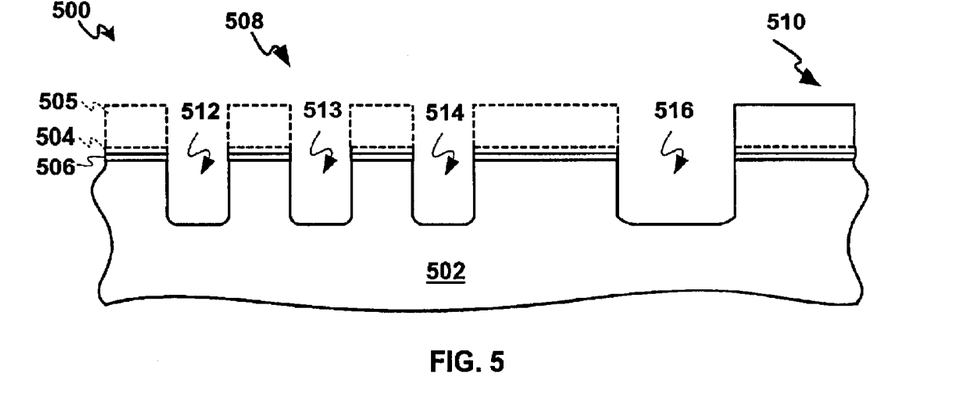
FIG. 5 is a substrate after a shallow trench isolation formation and fill process.

Referring now to FIG. 5, therein is shown a cross-sectional view of a partially processed memory device 500 including a semiconductor substrate 502 having an optional patterned anti-reflective coating (ARC) 504 and a patterned photoresist 505 which form a photomask, shown as a dotted line. The photomask has been used to form a patterned hard mask 506 on the semiconductor substrate 502 and then been removed. The hard mask 506 covers a core region 508 and a peripheral region 510.

The hard mask 506 has been used to etch openings in the semiconductor substrate 502 to form core trenches 512–514 in the core region 508 and a shallow trench isolation (STI) region 515 between the core region 508 and the peripheral region 510.

Figure 6:
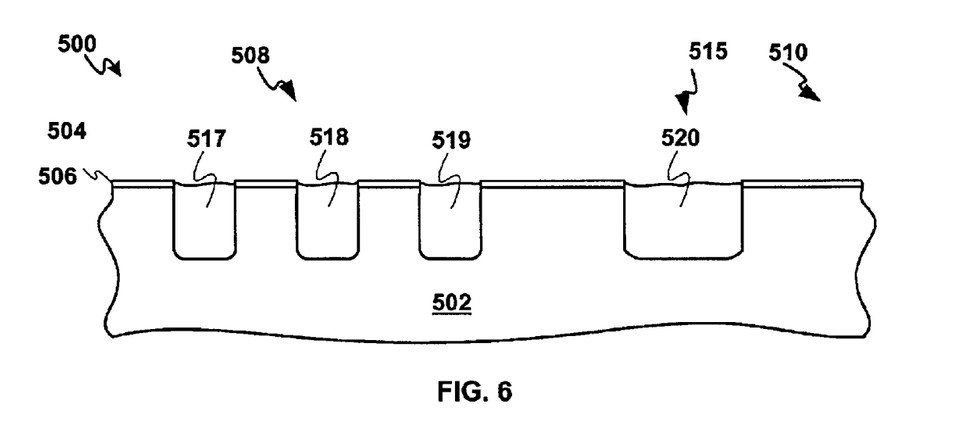
FIG. 6 is the structure of FIG. 6 after the creation of a core mask.

Referring now to FIG. 6, therein is shown the partially processed memory device 500 of FIG. 5 after an STI fill process which forms an isolation material, such as silicon oxide or silicon nitride, into the core trenches 512–514, and the STI trench 516 to form respective core isolations 517–519 and STI 520.

Figure 7:
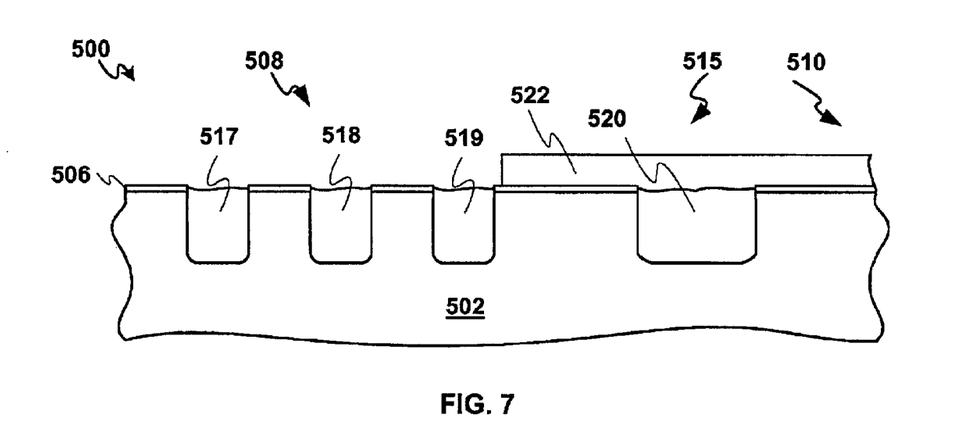
FIG. 7 is the structure of FIG. 7 after a core shallow trench isolation etch.

Referring now to FIG. 7, therein is shown the partially processed memory device 500 of FIG. 6 after photoresist is deposited over the partially processed memory device 500 and patterned to form a core mask 522. The core mask 522 does not have to be critically dimensioned and exposes the core region 508 and covers peripheral region 510, including the STI 520.

Figure 8:
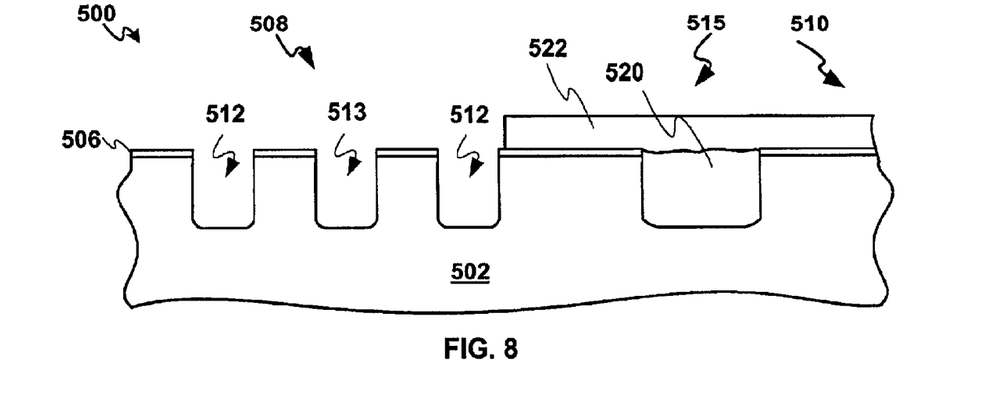
FIG. 8 is the structure of FIG. 8 after the core mask removal and doped bitline deposition.

Referring now to FIG. 8, therein is shown the partially processed memory device 500 of FIG. 7 after an etch removes the core isolations 517–519 in the core trenches 512–514. The core mask 522 protects the STI 520 and the insulating material is not removed.

Figure 9:
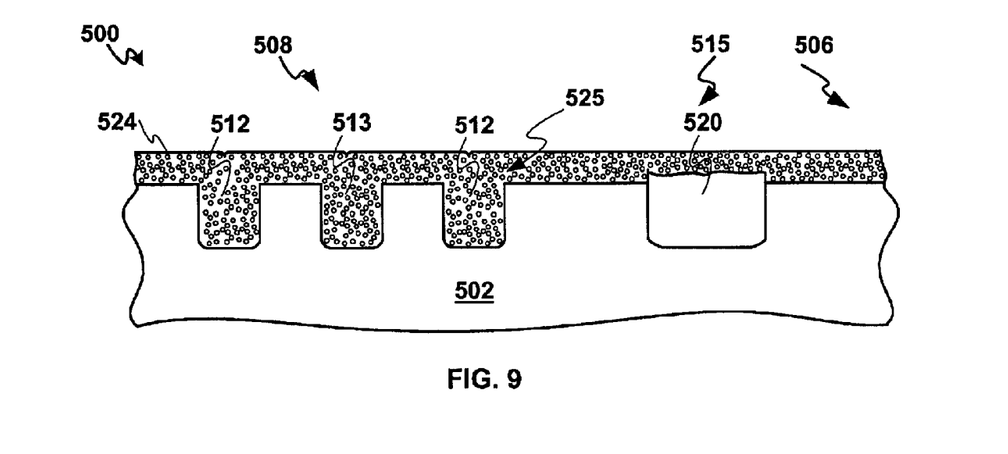
FIG. 9 is the structure of FIG. 9 after planarization and thermal anneal processes.

Referring now to FIG. 9, therein is shown the partially processed memory device 500 of FIG. 8 after the core mask 522, the optional ARC 504, and the hard mask 506 are removed by a stripping process. A layer of doped, highly conductive, bitline material 524, such as doped polysilicon, has been deposited over the surface of the partially processed memory device 500 and in the core trenches 512–514.

Figure 10:
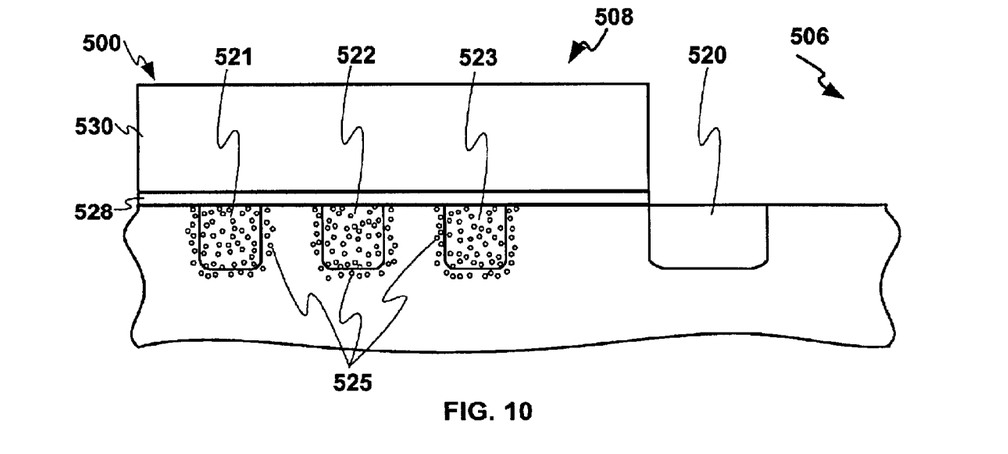
FIG. 10 is a cross-sectional view of a Flash memory cell similar to a cross-sectional view along line 5—5 in FIG. 3 (PRIOR ART)

Referring now to FIG. 10, therein is shown the partially processed memory device 500 of FIG. 9 after the layer of doped, high conductivity, bitline material 524 and the STI 520 are planarized by a planarization technique, such as chemical-mechanical polishing (CMP) process. The result is a planar surface with the doped, high conductivity material inlaid in the core trenches 512–514.

To form high conductivity bitlines 521–523, a thermal annealing process is used to diffuse dopant 525 from the doped, high conductivity material into the semiconductor substrate 502 to provide required electrons in the same fashion as implanted bitlines.

It should be noted that in contrast to the implanted bitlines 412 and 414 in FIG. 4 (PRIOR ART), the high conductivity bitlines 521–523 are formed from the combination of highly conductive polysilicon and outdiffused dopant in the semiconductor substrate 502. These filled-trench bitlines have a lower resistivity and higher conductivity when compared to their implanted prior art counterparts. The term "high conductivity bitline" defines a bitline with a conductivity higher than that of a bitline in which a dopant is implanted into silicon and used alone as the conductive line.

As a further advantage, instead of separate STI construction steps and the bitline creation steps of masking, implantation, and mask-removal steps of the prior art, the current invention uses integration of the STI manufacturing steps to create the bitlines, resulting in fewer, less complicated process steps.

In addition, the spacing of the trench-filled bitlines can be very close together since the STI trench locations can be easily and extremely tightly controlled by masking. The degree of diffusion of the doping can be controlled by time and temperature so as to as to have the dopant very close to the implanted bitlines 412 and 414 to allow them to be much closer together.

Thereafter, a charge-trapping dielectric layer 528 and a wordline 530 are formed to substantially complete the Flash memory device 500.

Figure 11:
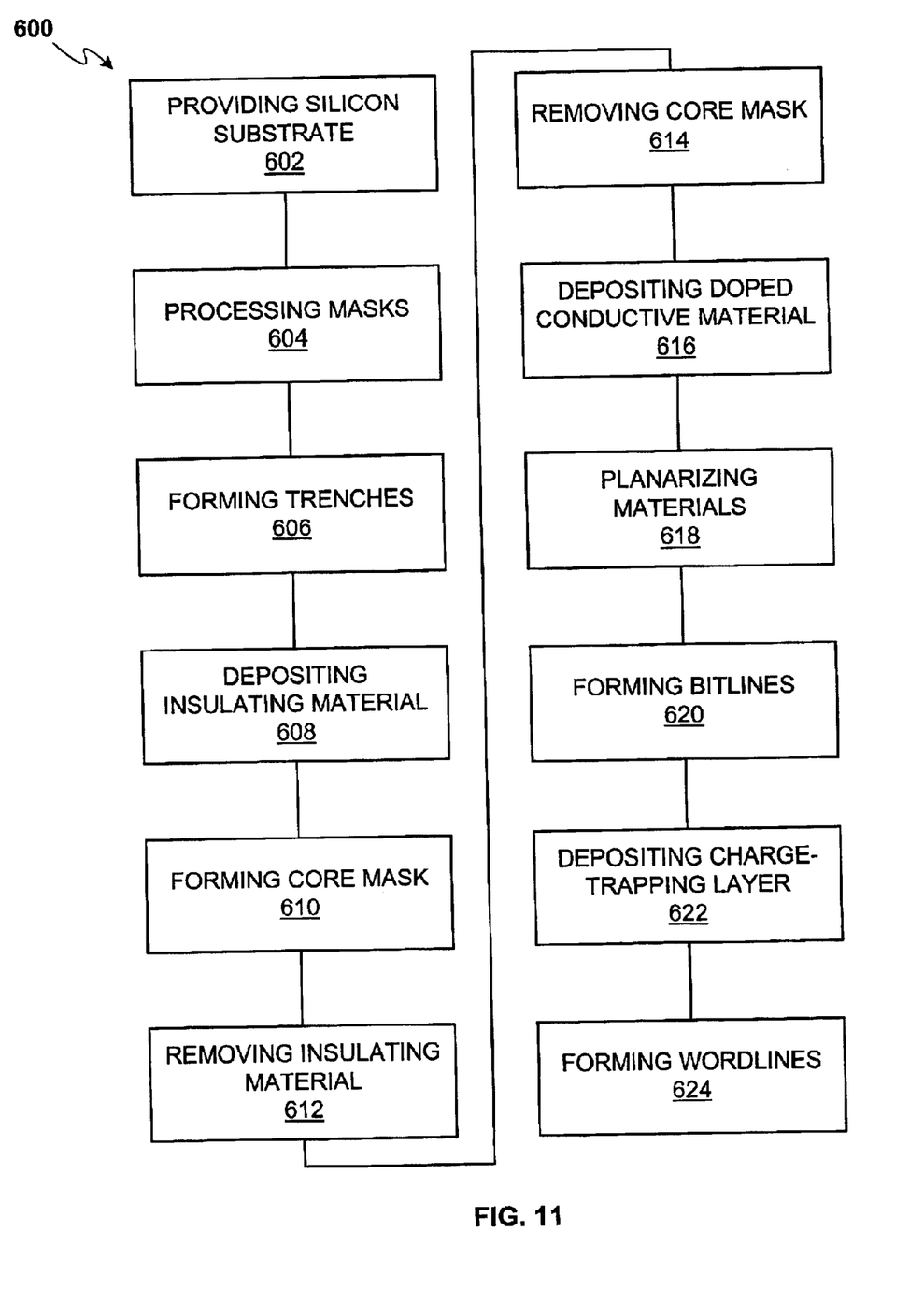
FIG. 11 is shown a simplified process chart of the present invention.

Referring now to FIG. 11, therein is shown a simplified process chart 600 of the present invention which includes: providing semiconductor substrate 602; processing masks 604; forming trenches 606; depositing insulating material 608; forming a core mask 610; removing insulating material 612; removing the core mask 614; depositing doped conductive material 616; planarizing doped conductive material and insulating material 618; annealing doped conductive material to form bitlines 620; depositing charge-trapping layer 622; and forming wordlines 624.

Various implementations of dual bit memory cell and other semiconductor device architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

What is claimed is:

1. A method of manufacturing an integrated circuit comprising:
    processing a substrate to form a core opening and an isolation opening;
    depositing an insulating material in the core opening and the isolation opening;
    forming a core mask over the isolation opening;
    removing the insulating material in the core opening using the core mask;
    removing the core mask;
    depositing a doped bitline material over the core opening and the isolation opening;
    planarizing the doped bitline material; and
    thermal annealing the doped bitline material to form a high conductivity bitline.

2. The method of manufacturing an integrated circuit as claimed in claim 1 wherein:
    depositing the doped bitline material deposits a doped polysilicon; and
    thermal annealing causes dopant diffusion into the substrate to form the high conductivity bitline.

3. The method of manufacturing an integrated circuit as claimed in claim 1 wherein the insulating material is selected from a group consisting of oxides and nitrides.

4. The method of manufacturing an integrated circuit as claimed in claim 1 wherein planarizing the doped bitline material planarizes the insulating material over the isolation opening to form an isolation region.

5. The method of manufacturing an integrated circuit as claimed in claim 1 wherein:
    processing the substrate includes forming a core region and a peripheral region; and
    forming the core mask covers the peripheral region and exposes the core region.

6. The method of manufacturing an integrated circuit as claimed in claim 1 wherein processing the substrate includes:
    depositing a hard mask layer on the substrate;
    depositing a photoresist on the hard mask layer;
    processing the photoresist and the hard mask layer to form a hard mask; and
    using the hard mask to form the core opening and the isolation opening.

7. The method of manufacturing an integrated circuit as claimed in claim 1 including:
    depositing a charge-trapping layer over the high conductivity bitline and the substrate;
    depositing a wordline layer over the charge-trapping layer; and
    forming a wordline over and perpendicular to the high conductivity bitline.

8. A method of manufacturing an integrated circuit comprising:
    providing a semiconductor substrate;
    processing the semiconductor substrate to form a core trench and a shallow trench isolation (STI) trench;
    depositing an insulating material in the core trench and the STI trench;
    depositing a photoresist over the core trench and the STI trench;
    processing the photoresist to form a core mask over the STI trench;
    removing the insulating material in the core trench using the core mask;
    removing the core mask;
    depositing a doped bitline material over the core trench and the STI trench;
    planarizing the doped bitline material and the insulating material; and
    thermal annealing the doped bitline material to form a high conductivity bitline.

9. The method of manufacturing an integrated circuit as claimed in claim 8 wherein:
    depositing the doped bitline material deposits a doped polysilicon; and thermal annealing causes dopant diffusion from the doped bitline material into the semiconductor substrate to form the high conductivity bitline.

10. The method of manufacturing an integrated circuit as claimed in claim 8 wherein the insulating material is selected from a group consisting of oxides and nitrides.

11. The method of manufacturing an integrated circuit as claimed in claim 8 wherein planarizing the doped bitline material simultaneously planarizes the insulating material over the STI trench to form a STI.

12. The method of manufacturing an integrated circuit as claimed in claim 8 wherein:

processing the substrate includes forming a core region and a peripheral region separated by the STI trench; and processing the photoresist to form the core mask covers the peripheral region and exposes the core region, the core mask also covers the insulating material in the STI trench.

13. The method of manufacturing an integrated circuit as claimed in claim 8 wherein processing the substrate includes:

depositing a hard mask layer on the substrate;

depositing an anti-reflective coating on the hard mask layer;

depositing a further photoresist on the anti-reflective coating;

processing the further photoresist, the anti-reflective coating, and the hard mask layer to form a hard mask; and using the hard mask to form the core trench and shallow trench isolation trench.

14. The method of manufacturing an integrated circuit as claimed in claim 8 including:

depositing a charge-trapping layer over the high conductivity bitline;

depositing a wordline layer over the charge-trapping layer;

processing an additional photoresist layer, an additional anti-reflective coating layer, and a hard mask layer to form a patterned photoresist and patterned antireflective coating;

using the patterned photoresist and patterned anti-reflective coating to form a hard mask; and using the hard mask to form a wordline over and perpendicular to the high conductivity bitline.

15. A method of manufacturing a Flash memory integrated circuit comprising:

providing a semiconductor substrate;

processing the semiconductor substrate to form a plurality core trenches parallel and spaced apart and a plurality of shallow trench isolation (STI) trenches enclosing portions of the semiconductor substrate;

depositing an insulating material over and in the core trench and the STI trench;

depositing a photoresist over the semiconductor substrate, the plurality of core trenches, and the plurality of STI trenches;

processing the photoresist to form a core mask over a portion of the semiconductor substrate and the plurality of STI trenches;

removing the insulating material in the plurality of core trenches using the core mask;

removing the core mask;

depositing a doped bitline material in the plurality of core trenches and the plurality of STI trenches;

planarizing the doped bitline material and the insulating material; and thermal annealing the doped bitline material to form a plurality of high conductivity bitlines.

16. The method of manufacturing a Flash memory integrated circuit as claimed in claim 15 wherein:

providing the semiconductor substrate provides a p-doped semiconductor substrate;

depositing the doped bitline material deposits a n-doped polysilicon; and thermal annealing causes n-dopant from the doped bitline material into the semiconductor substrate to form the plurality of high conductivity bitlines.

17. The method of manufacturing a Flash memory integrated circuit as claimed in claim 15 wherein the insulating material is selected from a group consisting of oxides and nitrides.

18. The method of manufacturing a Flash memory integrated circuit as claimed in claim 15 wherein planarizing the doped bitline material and the insulating material on the semiconductor substrate using chemical mechanical polishing simultaneously forms a plurality of bitlines and a plurality of STIs.

19. The method of manufacturing a Flash memory integrated circuit as claimed in claim 15 wherein:

processing the semiconductor substrate includes forming a core region and a peripheral region separated by at least one of the plurality of STI trenches; and processing the photoresist to form the core mask covers the peripheral region and exposes the core region, the core mask also covers the insulating material in the STI trench.

20. The method of manufacturing a Flash memory integrated circuit as claimed in claim 15 wherein processing the substrate includes:

depositing a hard mask layer on the semiconductor substrate;

depositing an anti-reflective coating on the hard mask layer;

depositing a further photoresist on the anti-reflective coating;

processing the further photoresist, the anti-reflective coating, and the hard mask layer to form a hard mask;

removing the further photoresist and the anti-reflective coating;

using the hard mask to form the core trench and shallow trench isolation trench; and removing the hard mask.

21. The method of manufacturing a Flash memory integrated circuit as claimed in claim 15 including:

depositing a charge-trapping layer over the plurality of high conductivity bitlines;

depositing a wordline layer over the charge-trapping layer;

processing an additional photoresist layer, an additional anti-reflective coating layer, and a hard mask layer to form a patterned photoresist and patterned anti-reflective coating;

using the patterned photoresist and patterned anti-reflective coating to form a hard mask; and using the hard mask to form a plurality of wordlines over and perpendicular to the plurality of high conductivity bitlines.

* * * * *